(12) United States Patent
Ueno

(10) Patent No.: US 6,680,247 B2
(45) Date of Patent: Jan. 20, 2004

(54) MANUFACTURING METHOD OF A SEMICONDUCTOR DEVICE

(75) Inventor: Kazuyoshi Ueno, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 55 days.

(21) Appl. No.: 10/004,859

(22) Filed: Dec. 7, 2001

(65) Prior Publication Data

US 2002/0072226 A1 Jun. 13, 2002

(30) Foreign Application Priority Data

Dec. 8, 2000 (JP) ........................ 2000-374352

(51) Int. Cl.[7] ......................................... H01L 21/4763
(52) U.S. Cl. .................. 438/637; 438/687; 438/639; 438/672; 438/673; 438/700
(58) Field of Search ................ 438/687, 688, 438/627, 628, 629, 637, 638, 700

(56) References Cited

U.S. PATENT DOCUMENTS 5,985,762 A * 11/1999 Geffken et al. ............. 438/687
6,169,024 B1 * 1/2001 Hussein ...................... 438/627
6,261,963 B1 * 7/2001 Zhao et al. ................. 438/704

FOREIGN PATENT DOCUMENTS

| JP | 9-312291 | 12/1997 |
| JP | 10-261715 | 9/1998 |

* cited by examiner

*Primary Examiner*—Dung Anh Le
(74) *Attorney, Agent, or Firm*—Young & Thompson

(57) ABSTRACT

The manufacturing method of a semiconductor device includes a step of forming a lower wiring on a semiconductor substrate, a step of forming a layer insulating film on the lower wiring, a step of forming an opening that exposes the lower wiring by removing a part of the layer insulating film, a step of forming a barrier film in the opening and a step of forming an upper wiring in the opening, where the lower wiring and the upper wiring are copper including wirings composed of copper or a copper alloy, the barrier film covers the bottom face and the side face of the opening, and the barrier film on the bottom face of the opening is formed so as to have its thickness to be less than twice the diffusion length of the copper atoms in the barrier film.

20 Claims, 4 Drawing Sheets

MANUFACTURING METHOD OF A SEMICONDUCTOR DEVICE

BACKGROUND OF THE INVENTION

1. Field of the Invention

The present invention relates to a manufacturing method of a semiconductor device, and more particularly to a formation method of a barrier layer in a semiconductor device having the damascene structure.

2. Description of the Prior Art

When a metal containing copper is used for both of an upper wiring and a lower wiring, it is necessary to design the manufacturing processes by paying a special attention to electromigration (referred to as EM hereinafter) in the vicinity of a via hole connecting these wirings. What is called EM is a phenomenon in which metal atoms constituting a conductor wiring are transported in the direction of flow of the electrons by the current, and the time from application of stresses of a dc current and temperature to the conductor wiring till the disconnection of the conductor wiring is called EM life.

Wiring connection structures in a via hole include the following examples.

A first conventional structure is one in which a via plug 111 and a lower wiring 105 are connected with a barrier film 110 that prevents the diffusion of copper (Cu) atoms interposed between them, as shown in a sectional view of the vicinity of the via hole in FIG. 3A.

A second conventional structure is one in which a via plug 211 and a lower wiring 205 are connected without having a barrier film that prevents the diffusion of Cu atoms between them, as in FIG. 3B that shows Japanese Patent Applications Laid Open, No. Hei-9-312291 (a method in which no barrier film is formed between an upper and a lower wirings is also shown in Japanese Patent Applications Laid Open, No. Hei-10-261715).

The manufacturing methods of the second conventional structure in the above include the following method shown in FIG. 4. Namely, after embedding the lower wiring 205 in a first layer insulating film 203, a nitride film 206, a second layer insulating film 207, a nitride film 216 and a third layer insulating film 214 are deposited on the entire surface, a via hole 208 is formed by drilling these films in a single stroke and a trench for an upper wiring is formed by selectively removing the third layer insulating film 214 (FIG. 4A)

A barrier film 210 is deposited on the entire surface, then the barrier film 210 is etched back to leave the barrier film on the side face of the via hole 208, and Cu is deposited on top of it (FIG. 4B)

In the via hole 208, the barrier film 210 is formed only on the side face of the via hole 208, and the nitride film 206 is not formed on the top face of the lower wiring 205 and the bottom face of the via plug 211. Therefore, when viewed through the upper and lower wirings, the interfaces making contact with Cu have different structures in two regions, namely, at the interface of Cu with the barrier film 210 on the side face and at the interface with the lower wiring, in the vicinity of the via hole.

The wiring structures in the vicinity of the via hole and the methods of wiring formation described in the above have the following problems.

First, in the first conventional structure, voids are generated in the wirings at the bottom part of the via hole which gives rise to a deterioration in the EM life.

This tendency to generate defects (voids) by EM is caused when a current, namely, a flow of the electrons, is generated between the lower wiring 105 and the upper wiring 121, by the blocking of the flow of the Cu atoms accompanying the movement of the electrons. Moreover, replenishment of the Cu atoms for compensating the Cu atoms responsible for the formation of the voids is made unavailable, causing a deterioration in the EM life.

Next, in the second conventional structure, hindrance to the EM is relaxed compared with the case in the first conventional structure, nonetheless the generation of the voids occurs in the vicinity of the via hole and a deterioration in the EM life takes place. This deterioration in the EM life is due to the deterioration of the adhesion at the interface of the barrier film on the side face of the via hole and Cu embedded in the via hole, which is caused by the contamination of the surface of the barrier film during the etch-back of the barrier film.

Moreover, since no barrier film is formed between the top face of the lower wiring and the bottom face of the via hole, formation of the voids on the depletion side of Cu atoms is suppressed and the drawback in the first conventional structure is overcome. However, since the current flow concentrates at the corners where the direction of the current flow is changed by 90 and the movement of the atoms is promoted than in the surroundings, the Cu atoms flow out from there without restriction. This leads to an easy generation of the voids, which in turn results in a deterioration in the EM life. Furthermore, the materials making contact with Cu are different on the side face and on the bottom face of the upper wiring, and a discontinuity in the flow of atoms arises and the voids tend to be formed easily at the regions where the two kinds of interface (having different diffusion rates) are brought into contact.

In the manufacturing method of the second conventional structure, the barrier film is etched back and Cu atoms are deposited on the surface of the etched-back barrier film. In this method, a surface modified layer 215 indicated by the crosses due to oxidation or etch-back is formed on the interface of Cu and the barrier film, and the adhesion of the barrier film to Cu is deteriorated. The interface of the barrier film and Cu being the principal diffusion path of Cu atoms by EM, the deterioration in the adhesion of the interface leads to an increase in the diffusion rate of the Cu atoms and to a deterioration in the EM life.

BRIEF SUMMARY OF THE INVENTION

Object of the Invention

It is the object of the present invention to provide a formation method of a barrier film which can excellently cope with the hindrance to the EM in connecting an upper and a lower wirings formed of a Cu containing metal in a via hole having a large aspect ratio.

SUMMARY OF THE INVENTION

The manufacturing method of a semiconductor device according to the present invention includes a step of forming a lower wiring on a semiconductor substrate, a step of forming a layer insulating film on the lower wiring, a step of forming an opening which exposes the lower wiring by removing apart of the layer insulating film, a step of forming a barrier film in the opening and a step of forming an upper wiring in the opening. The lower and upper wirings are copper containing wirings formed of copper or a copper alloy, the barrier film covers the bottom face and the side face of the opening, and the barrier film on the bottom face of the opening is formed to have a thickness which is less than twice the diffusion length of the copper atoms in the barrier film.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTIO

Referring to the sectional views of the manufacturing processes in FIG. 1, a first embodiment of the semiconductor device according to the present invention will be described.

Figure 1A:
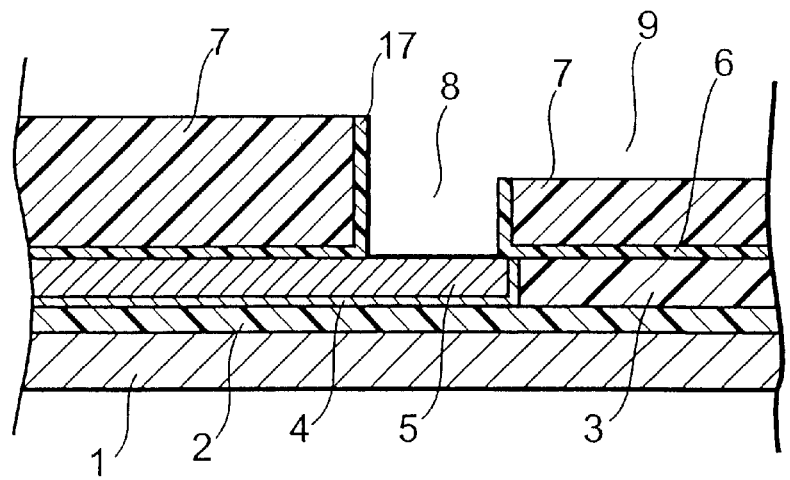
FIGS. 1(A–C) are sectional views showing the semiconductor device and its manufacturing method of a first embodiment of the present invention arranged in the order of manufacturing processes.

First, a liner insulating film 2 which becomes the base layer of a lower wiring is formed on a semiconductor substrate 1, and a lower wiring 5 is formed on top of it by the damascene method (embedded wiring formation method). The procedure is, first, a first layer insulating film 3 composed of an oxide film is deposited on the liner insulating film 2, and a trench pattern for the lower wiring is formed in the first layer insulating film 3 by photolithography and etching. Then, by sequentially depositing a barrier film of TaN or the like and a lower wiring material composed of Cu or a Cu alloy, and exposing the surface of the first layer insulating film 3 by polishing employing CMP, a barrier film 4 and a lower wiring 5 on are formed on top of it. Then, a nitride film 6 and a second layer insulating film 7 comprising an oxide film covering the lower wiring are formed, a via hole 8 with an aspect ratio of 4.0 to 5.0, for example, is opened in the nitride film 6 and the second layer insulating film 7 that are located on the lower wiring 5, and at the same time, a trench 9 is formed in the second layer insulating film 7. Moreover, a sidewall nitride film 17 is formed on the side face of the via hole 8 as a barrier sidewall insulating film (FIG. 1A). In this case, the trench 9 is connected to the via hole 8, but it is of course possible to form a trench independently in another region of the second insulating film. Furthermore, if the thickness of a barrier film provided in the later process is to be given a sufficient value against the diffusion of the Cu atoms, it is possible to prevent the diffusion of the Cu atoms from the Cu containing metal to be filled in the via hole 8, so that the formation of the sidewall nitride film 17 may be omitted.

Next, a barrier film 10 composed of Ta is deposited on the second layer insulating film 7 with formed via hole 8 by employing ionization sputtering, long slow sputtering, collimated sputtering or the like. In the contact part of the bottom face of the via hole 8 with the lower wiring 5, the barrier film 10 appears as a via hole bottom face barrier film 20 that has a thickness larger than the thickness of lamination of two Ta atoms, and smaller than twice the diffusion length of the Cu atoms.

The reason for forming the barrier film 20 with the thickness of less than twice the diffusion length of the Cu atoms is the following. The barrier film 20 on the bottom face of the via hole 8 makes contact with the lower wiring 5 through its one face, and makes contact with the via plug 11 which is a part of the upper wiring 21 through the other face. Accordingly, Cu atoms diffuse from both faces of the barrier film 20 toward the central part in the thickness direction. If the thickness of the barrier film 20 is less than the sum of the diffusion lengths of the Cu atoms from both faces, it becomes possible for the Cu atoms to move from one face to the other. The diffusion lengths from both faces are different depending upon the material, constitution (single layer film or laminated film or the like) of the barrier film, and in the case of a single layer film, for example, both diffusion lengths are almost equal. Accordingly, the thickness of the barrier film may be set less than twice the diffusion length of the Cu atoms.

Figure 1B:
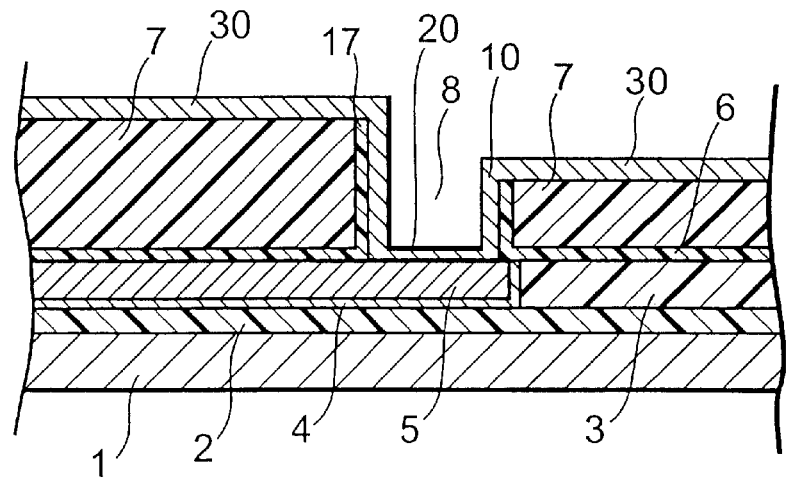

Moreover, the thickness of the barrier film 20 at the bottom face of the via hole is selected specifically to be in the range of 0.5 to 5.0 nm (FIG. 1B). Furthermore, the barrier film 10 on the second layer insulating film 7 is formed into a thick flat part barrier film 30 with a thickness of, for example, 5 to 10 times that of the bottom face barrier film 20 of the via hole.

As the material for the barrier film, various kinds may be enumerated. It includes a single layer film of tantalum (Ta), tungsten (W) or titanium (Ti), or titanium nitride, tantalum nitride or tungsten nitride, or tungsten carbide, titanium carbide or tantalum carbide, or TaCN, WCN or TiCN, or a laminated film of a single layer film in the above and a nitride or carbide in the above.

Moreover, when the barrier film is a laminated film, it takes a constitution in which the laminated film is obtained by either forming a single layer film mentioned above on a single film of a nitride or a carbide, or forming a single layer film of a nitride or a carbide on a single layer film mentioned above.

Figure 1C:
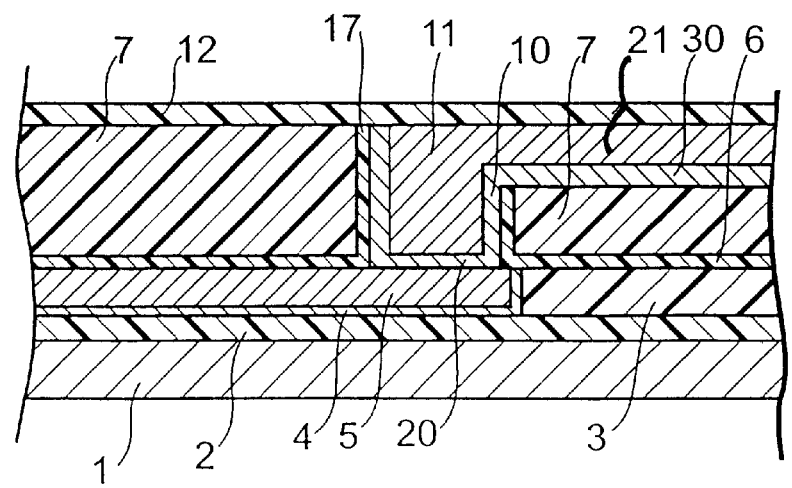

Next, Cu or a Cu alloy that becomes an upper wiring is deposited continuously on the semiconductor substrate having formed barrier film 10, while keeping the vacuum adopted during the deposition of the barrier film 10, and Cu or a Cu alloy is deposited by plating or the like, followed by the formation of an upper wiring 21 by patterning, and finally a nitride film 12 is formed covering the entire surface (FIG. 1C).

Figure 3A:
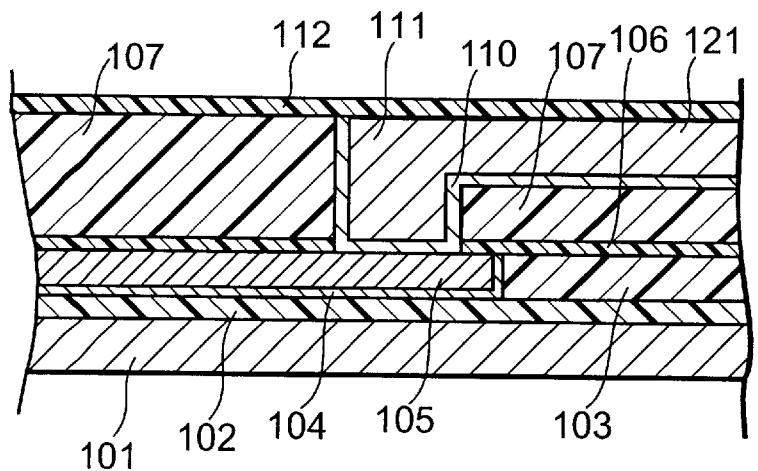
FIGS. 3A and 3B are sectional views of a first and second conventional structures showing the respective via holes and their vicinity.

The first conventional structure shown in FIG. 3A having a barrier film formed on the bottom part of the via hole, lacks the capability to compensate for the depletion of the Cu atoms because of the blocking, by the barrier film, of the inter-diffusion of the Cu atoms in the Cu containing wirings that constitute the upper and lower wirings. In contrast, in the present embodiment, the barrier film at the bottom part of the via hole mediates the inter-diffusion of the Cu atoms that are found adjacent to the barrier film, and induces the mutual compensation of the deficiency (due to EM, for example) of the Cu atoms in the mutual regions.

Such an action of inter-diffusion of the Cu atoms can be made to take place when the thickness of the barrier film at the bottom part of the via hole is selected to be less than a definite thickness (5 nm in the case of Ta).

Figure 3B:
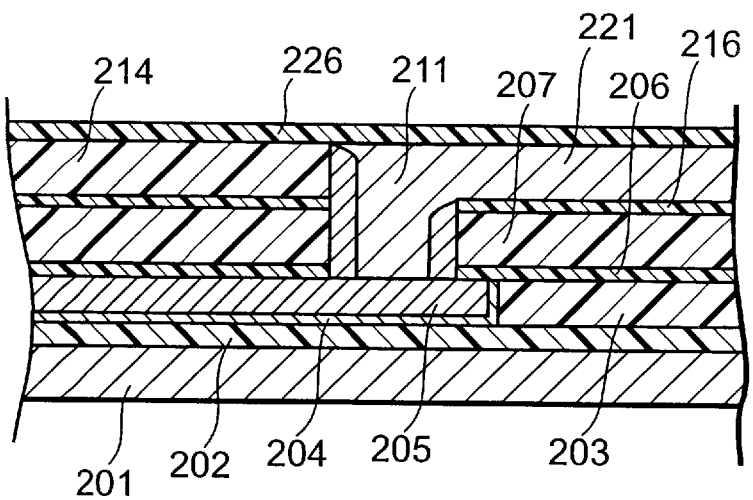

Moreover, when the structure of the present embodiment is compared with the second conventional structure shown in FIG. 3B with no barrier film at the bottom part of the via hole, in the second conventional structure, current concentration is apt to take place and disconnection is liable to occur at the portions (corners) where the direction of the current at the bottom part of the via hole is changed. In contrast to this, in the present embodiment, the upper and lower wirings pinch a barrier film with resistivity higher than that of Cu (in the case of Ta, for example, the resistivity is 250 $\mu\Omega$cm), so that there is caused a dispersion of the current and the current concentration at the corners is relaxed.

Furthermore, the barrier film contains Cu atoms at a definite density distribution due to diffusion of the Cu atoms from the Cu containing metals that constitute the upper and lower wirings. The density distribution varies with the material and the constitution (whether it is a single layer film or a laminated film or the like) of the barrier film, but generally speaking, the density of the Cu atom decreases as one proceeds toward the central part from the upper and lower ends in the film thickness direction of the barrier film, and the density of the Cu atom shows a minimum value at a certain position in the middle of the thickness direction. Accordingly, in the barrier film of the present embodiment, it is considered that the state in which the minimum value of the Cu atom density at a certain position in the thickness direction of the barrier film is more than $1.0 \times 10^{10}$ particles/cm$^3$ is optimum as the barrier film. A barrier film containing Cu atoms of such a density can compensate the Cu atom deficiency in the wiring formed of Cu by supplementing Cu atoms through diffusion, and the deficiency of Cu atoms in the barrier film can be supplemented from the Cu layer side through diffusion. As a result of the chain of diffusion processes, Cu atoms are sequentially diffused to the side with a deficiency in the Cu atoms to compensate for the deficiency of the Cu atoms.

Besides, the conventional structure shown in FIG. 3B where no barrier film is formed in the bottom part of the via hole induces two demerits because of the leaving of the barrier film on the side face of the via hole. First is that due to the occurrence of two kinds of interface, namely, interfaces with and without a barrier film, discontinuity in the flow of atoms occurs and voids are generated at the positions where interfaces with two kinds of different diffusion rates of atoms are adjacent with each other, In contrast, in the present embodiment, there is only one kind of interface where the barrier film and Cu meet with each other, and creates no such discontinuity in diffusion. Second is that due to the etch-back in the conventional structure performed for the purpose of forming the barrier film only on the side face of the via hole, the barrier surface is contaminated, the atomic bonding of the barrier surface with Cu is weakened by oxidation or contamination, the interfacial diffusion rate is increased and the probability of void generation is asugmented. Since the etch-back is not performed in this embodiment, the bonding of the barrier film and Cu is not weakened by oxidation or contamination.

Due to the structure, operation and action of the present embodiment, voids tend to be formed less easily and reliability such as EM life is enhanced.

If it is attempted to form the structure of this embodiment, in particular a thin barrier film at the bottom part of the via hole, by employing the conventional manufacturing method, it is necessary to reduce the overall thickness of the film. However, by so doing, the film thickness needed to function as a stopping layer of CMP becomes deficient in the flat part of the layer insulating film when the wiring is formed by means of CMP.

For example, if it can be assumed that the film thickness necessary for stopping CMP is 25 nm, and a film thickness of 5 nm is needed at the bottom part of the via hole, it suffices to give a bottom coverage of 20%. By employing the structure of this embodiment and its method of manufacturing, it is possible to deposit a barrier film where the barrier film at the flat part of the layer insulating film can function as a CMP stopping layer, with less generation of voids in the bottom part of the via hole and can cope with EM satisfactorily.

Since it is possible to suppress the formation of voids at the bottom part of the via hole and surely stop CMP in this manner, reproducibility and uniformity of the wiring characteristics can be enhanced.

A more detailed description of the features of this embodiment is as follows.

According to the barrier film structure of this embodiment, diffusion of Cu atoms between the via plug and the upper and lower wirings takes place via the barrier film at the bottom part of the via hole, and when a depletion of atoms occurs at one interface due to EM, Cu atoms are replenished in an appropriate amount from the opposite interface, to compensate the deficiency, suppressing the increase in the voids. Moreover, the thin barrier film at the bottom part of the via hole disperses the current concentration at the bottom part of the via hole and suppresses the growth of the voids.

Moreover, in addition to the above effect rendered by the thin barrier film at the bottom part of the via hole, the flat part of the second layer insulating film holds a film thickness sufficient as a film stopper of the Cu containing material in carrying out CMP for the upper wiring formation, so that it can also provide an effect that the margin for CMP process is expanded and the distribution of the wiring resistance is improved.

Next, referring to FIG. 2, a second embodiment of the semiconductor device according to this invention will be described. Up to the formation of the via hole 8 the processes are approximately the same as in the first embodiment. What is different is that a nitride film 16 for preventing Cu diffusion is formed on the second layer insulating film in the trench region to a thickness of 40 to 50 nm, with similar structure for the second layer insulating film on the left of the via hole 8. Moreover, a third layer insulating film 14 is formed on the nitride film on the second layer insulating film on the left of the via hole 8, and there is no nitride film formed on the sidewall of the via hole 8. With these structures on the premise, the manufacturing processes after the formation of the via hole 8 will be described.

Figure 2A:
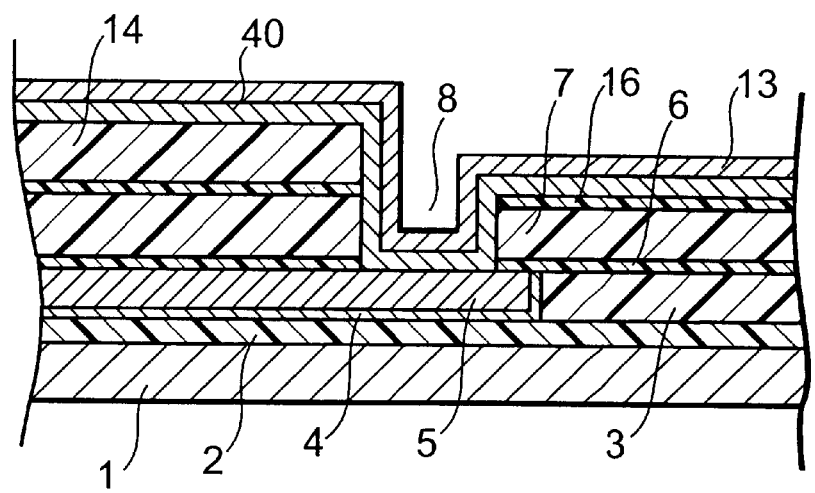
FIGS. 2(A–C) are sectional views of the semiconductor device and its manufacturing method of a second embodiment of the invention arranged in the order of the manufacturing processes.

After formation of the via hole 8 as in FIG. 1A, a barrier film 40 composed of Ta and a seed film 13 formed of Cu or a Cu alloy are deposited sequentially in vacuum on a second layer insulating film 7 and a third layer insulating film 14. Here, the barrier film 40 and the seed film 13 are deposited so as to have thicknesses of 5 to 40 nm and 10 to 50 nm, respectively, on the side face of the via hole 8 (FIG. 2A).

At this point, the role of the seed film will be described briefly.

At present, the most general method of filling the via hole with Cu is the electrochemical deposition (ECD) method. In filling the via hole with a Cu wiring, first, a liner metal layer (LM) for the Cu wiring is formed of a metal film composed of Ta or the like, then a seed film which becomes a liner seed layer that serves as the nucleus for the ECD growth is formed by a physical vapor deposition (PVD)method.

Figure 2B:
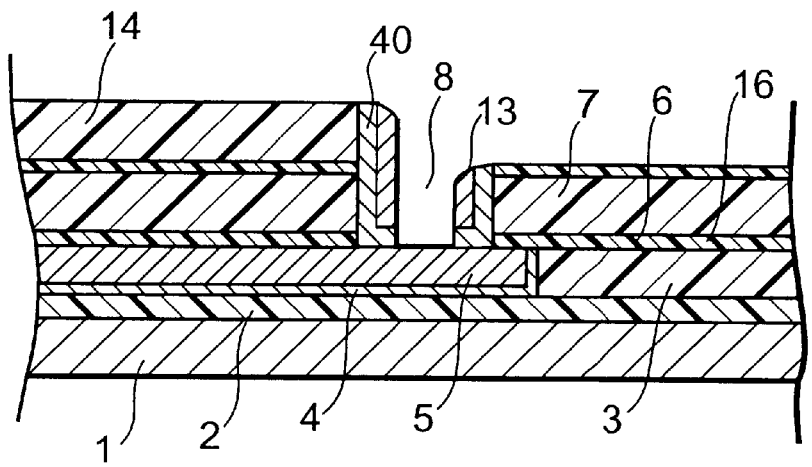

Next, the substrate is subjected to an etch-back to leave the barrier film 40 and the seed film 13 as sidewall films on the sidewall of the via hole 8 (FIG. 2B).

Figure 2C:
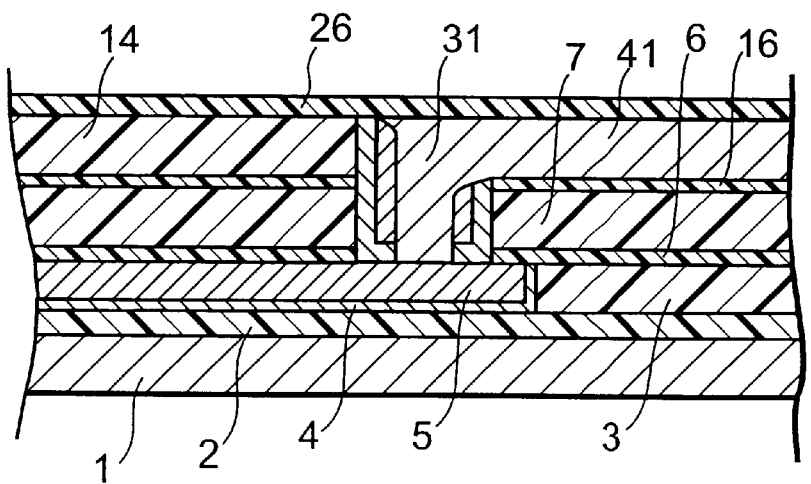

Finally, a Cu containing metal film containing Cu or a Cu alloy is filled in the via hole 8 with the side wall film consisting of the barrier film 40 and the seed film 13 formed on it, and an upper wiring 41 is obtained by flattening the Cu containing metal film. Further, a nitride film 26 is formed on the entire surface of the upper wiring 41 and the third layer insulating film 14 (FIG. 2C).

According to the method of this embodiment, etch-back is given after formation of the Cu interface consisting of the barrier film 40 and the seed film 13 having clean atomic bonding, so that the interfaces of the barrier film 40 and the seed film 13 are protected during the etching from the etching gas and the atomic bonding is not weakened.

Figure 4A:
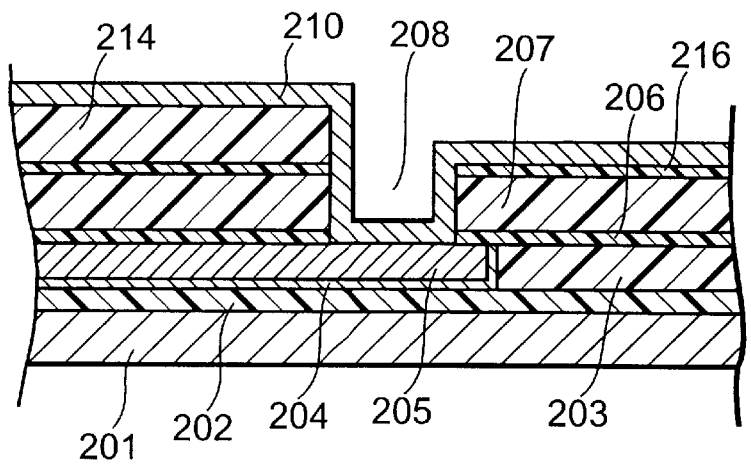
FIGS. 4A and 4B are sectional views arranged in the manufacturing order of the second convention structure.
Figure 4B:
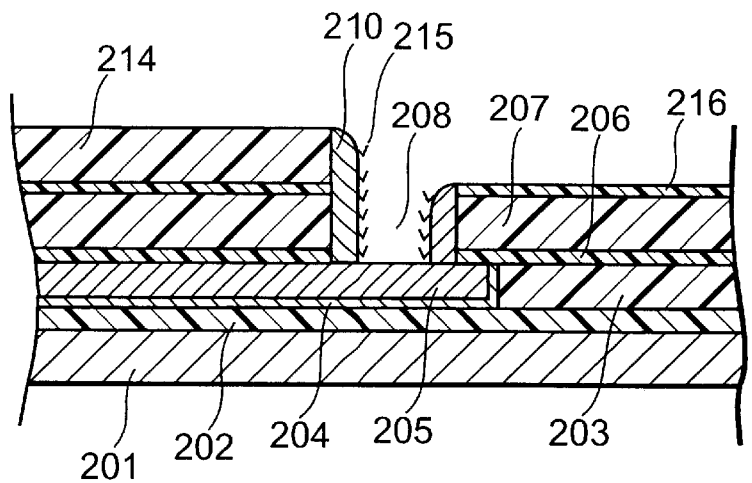

In the conventional formation method of the barrier film by etch-back as shown in FIG. 4, the surface of the barrier film is exposed to the etching gas, and the atomic bonding with Cu is weakened. In contrast, according to this embodiment, the interfaces of the barrier film and the upper wiring are not exposed to the etching gas during the etch-back of the bottom part of the via hole, and the weakening of the atomic bonding of the interfaces due to contamination and oxidation does not take place. As a result, the bonding deterioration at the barrier film and the deterioration of the upper wiring at the side face of the via hole pointed out in connection with the manufacturing method of the conventional barrier film shown in FIG. 4 can be prevented, the diffusion rate of the atoms of the upper wiring material (Cu atoms in this case) at the interfaces of the barrier film and the upper wiring is suppressed and the wiring reliability such as EM is enhanced.

In other words, in the barrier film structure according to this embodiment, there are not formed two kinds of interfaces as is the case in the conventional structure of the via hole where no barrier film is present, so that generation of voids due to discontinuity in the diffusion rate at the interface can be prevented.

As in the above, in a structure of a semiconductor device having upper and lower wirings formed of Cu containing metal which are connected by means of a via hole, the present invention regulates the thickness of the barrier film sandwiched between the upper and lower wirings to be such that the Cu atoms can be diffused mutually between the upper and lower wirings, and further, restricts the thickness of the film below the upper wiring to such an extent that can prevent the diffusion of the Cu atoms. As a result, it is possible to form a wiring structure that is optimum in view of enhancement of EM resistance and prevention of Cu contamination.

Moreover, by applying the manufacturing method of the present invention in which depositing a Cu seed film continuously on a barrier film, and then etching back these films, to the conventional manufacturing method in which a barrier film is left on the side face of the via hole, it is possible to preclude contamination on the surface of the barrier film, and enhance wiring reliability such as EM.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention

What is claimed is:

1. A manufacturing method of a semiconductor device comprising:

a step of forming a lower wiring on a semiconductor substrate, a step of forming a layer insulating film on said lower wiring, a step of forming an opening that exposes said lower wiring by removing a part of said layer insulating film, a step of forming a barrier film in said opening, and a step of forming an upper wiring in said opening, the upper wiring contacting the barrier film along a bottom face of the opening, wherein said lower wiring and said upper wiring are copper containing wirings composed of copper or a copper alloy, said barrier film covers the bottom face and a side face of the opening, and said barrier film on the bottom face is formed so as to have a positive thickness which is less than twice a diffusion length of a Cu atom in said barrier film.

2. The manufacturing method of a semiconductor device as claimed in claim 1, wherein the barrier film material for constituting said barrier film and the copper film or the copper alloy film formed directly above the barrier film material are formed by continuously depositing them in a vacuum.

3. The manufacturing method of a semiconductor device as claimed in claim 1, wherein said barrier film is either a single layer film of tantalum (Ta), tungsten (W) or titanium (Ti), or titanium nitride, tantalum nitride or tungsten nitride, or tungsten carbide, titanium carbide or tantalum carbide, or a laminated film of a single layer film and a nitride or a carbide enumerated in the above.

4. The manufacturing method of a semiconductor device as claimed in claim 3, wherein said barrier film is a laminated film obtained by forming one of said single layer film on one of said single layer film of nitride or carbide.

5. The manufacturing method of a semiconductor device as claimed in claim 1, wherein said barrier film is either a single layer film of tantalum (Ta), tungsten (W) or titanium (Ti), or titanium nitride, tantalum nitride or tungsten nitride, or tungsten carbide, titanium carbide or tantalum carbide, or a laminated film of a single layer film and a nitride or a carbide enumerated in the above.

6. The method of claim 1, wherein the thickness of the barrier film along the bottom face of the opening has is larger than a thickness of lamination of two Ta atoms.

7. The method of claim 1, wherein the thickness of the barrier film along the bottom face of the opening is a positive value less than 5 nm.

8. The method of claim 1, wherein the thickness of the barrier film along the bottom face of the opening is in the range of 0.5 to 5.0 nm.

9. A manufacturing method of a semiconductor device comprising:

a step of forming a lower wiring on a semiconductor substrate, a step of forming a layer insulating film on said lower wiring, a step of forming an opening that exposes said lower wiring by removing a part of said layer insulating film, a step of forming a barrier film in said opening, and a step of forming an upper wiring in said opening, wherein, said lower wiring and said upper wiring are copper containing wirings composed of copper or a copper alloy, said barrier film covers a bottom face and a side face of the opening, and said barrier film on the bottom face is formed so as to have a positive thickness which is less than twice a diffusion length of a Cu atom in said barrier film, and where in the step of forming a barrier film in said opening, said barrier film is formed also on a flat part of said layer insulating film and the barrier film on said flat part is formed so as to have a thickness larger than that of the barrier film on the bottom face of said opening.

10. The manufacturing method of a semiconductor device as claimed in claim 9, wherein the barrier film on the bottom face of said opening is formed so as to have a thickness smaller than 1/5 of the thickness of the barrier film on the flat part of said layer insulating film.

11. The manufacturing method of a semiconductor device as claimed in claim 10, where in the barrier film material for constituting said barrier film and the copper film or the copper alloy film formed directly above the barrier film material are formed by continuously depositing them in a vacuum.

12. The manufacturing method of a semiconductor device as claimed in claim 10, wherein said barrier film is either a single layer film of tantalum (Ta), tungsten (W) or titanium (Ti), or titanium nitride, tantalum nitride or tungsten nitride, or tungsten carbide, titanium carbide or tantalum carbide, or a laminated film of a single layer film and a nitride or a carbide enumerated in the above.

13. A manufacturing method of a semiconductor device comprising:

a step of forming a lower wiring on a semiconductor substrate, a step of forming a layer insulating film on said lower insulating film, a step of forming an opening that exposes said lower wiring by removing a part of said layer insulating film, a step of forming a barrier film in said opening, and a step of forming an upper wiring in said opening, the upper wiring contacting the barrier film along a bottom face of the opening, wherein said lower wiring and said upper wiring are copper containing wirings composed of copper or a copper alloy, said barrier film covers the bottom face and a side face of said opening, and the barrier film on the bottom face of said opening is formed with a positive thickness less than a sum of a diffusion length from one face and the diffusion length from the other face, of copper atoms in the barrier film at the bottom face of said opening.

14. The manufacturing method of a semiconductor device as claimed in claim 13, where in the step of forming a barrier film in said opening, said barrier film is formed also on a flat part of said layer insulating film and the barrier film on said flat part is formed so as to have a thickness larger than that of the barrier film on the bottom face of said opening.

15. The manufacturing method of a semiconductor device as claimed in claim 14, wherein the barrier film on the bottom face of said opening is formed so as to have a thickness smaller than 1/5 of the thickness of the barrier film on the flat part of said layer insulating film.

16. The method of claim 13, wherein the thickness of the barrier film along the bottom face of the opening has is larger than a thickness of lamination of two Ta atoms.

17. The method of claim 13, wherein the thickness of the barrier film along the bottom face of the opening is a positive value less than 5 nm.

18. The method of claim 13, wherein the thickness of the barrier film along the bottom face of the opening is in the range of 0.5 to 5.0 nm.

19. A manufacturing method of a semiconductor device comprising:

a step of forming a lower wiring on a semiconductor substrate, a step of forming a layer insulating film on said lower wiring, a step of forming an opening that exposes said lower wiring by removing a part of said layer insulating film, a step of forming a laminated sidewall film consisting of a barrier film and a seed film composed of copper or a copper alloy, starting with a side nearer to a side face of the opening, on the side face of the opening and a step of forming an upper wiring in said opening, wherein the step of forming said laminated sidewall film is performed by sequentially depositing a barrier film material and a seed film material on the layer insulating film including said opening, then leaving said barrier film material and said seed film material only on the sidewall of said opening by etch-back of the films.

20. The manufacturing method of a semiconductor device as claimed in claim 19, wherein the step of forming said laminated sidewall film is performed by sequentially depositing the barrier film material and the seed film material on the layer insulating film and in the opening including on the bottom of the opening, then leaving said barrier film material and said seed film material only on the sidewall of said opening by etch-back of the barrier film and the seed film simultaneously from the bottom and from horizontal portions of the layer insulating film.

* * * * *